(12) United States Patent
Kitani

(10) Patent No.: US 11,496,119 B1
(45) Date of Patent: Nov. 8, 2022

(54) OSCILLATOR CIRCUIT

(71) Applicant: Powerchip Semiconductor Manufacturing Corporation, Hsinchu (TW)

(72) Inventor: Tomofumi Kitani, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/396,771

(22) Filed: Aug. 9, 2021

(51) Int. Cl.
| H03K 3/037 | (2006.01) |
| H03F 3/45 | (2006.01) |
| H03K 19/20 | (2006.01) |
| H03K 3/017 | (2006.01) |

(52) U.S. Cl.
CPC ......... *H03K 3/037* (2013.01); *H03F 3/45475* (2013.01); *H03K 3/017* (2013.01); *H03K 19/20* (2013.01)

(58) Field of Classification Search
CPC ........ H03K 3/037; H03K 19/20; H03K 3/017; H03K 5/04; H03K 5/156; H03K 5/1565; H03K 7/08; H03K 3/00; H03F 3/45475
See application file for complete search history.

(56) References Cited

U.S. PATENT DOCUMENTS

| 5,532,653 | A |   | 7/1996 | Adkins |
| 5,920,511 | A | * | 7/1999 | Lee ..................... G11C 7/1066 365/194 |
| 6,456,170 | B1 |   | 9/2002 | Segawa et al. |
| 7,893,778 | B2 |   | 2/2011 | Mohtashemi et al. |
| 8,643,442 | B2 |   | 2/2014 | Wang |
| 8,643,443 | B1 |   | 2/2014 | Wang |
| 8,884,666 | B2 |   | 11/2014 | Passerini et al. |
| 9,214,927 | B2 |   | 12/2015 | Wang |
| 9,401,703 | B1 |   | 7/2016 | Wang et al. |
| 2006/0038625 | A1 |   | 2/2006 | Ricard et al. |
| 2006/0061422 | A1 |   | 3/2006 | Cho et al. |
| 2006/0097813 | A1 |   | 5/2006 | Won |
| 2007/0241832 | A1 |   | 10/2007 | Nervegna |
| 2009/0085680 | A1 |   | 4/2009 | Kim |
| 2013/0223152 | A1 |   | 8/2013 | Passerini et al. |

OTHER PUBLICATIONS

"Office Action of Taiwan Counterpart Application", dated Feb. 17, 2022, p. 1-p. 3.

\* cited by examiner

*Primary Examiner* — Jung Kim
(74) *Attorney, Agent, or Firm* — JCIPRNET

(57) ABSTRACT

An oscillator circuit is provided. A first and a second cycle generating units, and a first and a second duty generating units are included. An SR latch, receiving outputs the first and second cycle generating units. In the SR latch, an output is provided to the first cycle generating unit and the third duty generating, and a contemporary output is provided to the second cycle generating unit and the second duty generating unit. A logic circuit receives the outputs of the first and the second duty generating units and the output and the contemporary output of the SR latch to generate a clock signal. The first and the second cycle generating units are respectively operated to provide the even and odd cycle times of the clock signal. The first and the second duty generating units are respectively operated to provide the even and odd duties of the clock signal.

10 Claims, 7 Drawing Sheets

OSCILLATOR CIRCUIT

BACKGROUND

Technical Field

The disclosure relates to an oscillator circuit.

Description of Related Art

Semiconductor memory device commonly has an oscillator circuit to run an operation. As shown in FIG. 1A, the oscillator circuit usually comprises a SR latch 12 and two sets of a capacitors $C_1$, $C_2$ and a comparator A1, A2. These two sets of circuits operate alternatively to generates a clock signal as shown in FIG. 1B, including a low period $t_L$ and a high period $t_H$. As a result, the cycle time $t_{CYC1}$ of the clock signal can be expressed as following formula (1). In addition, the low period $t_L$ and the high period $t_H$ can be calculates based on following formula (2) and (3).

$$t_{cyc1} = t_H + t_L \qquad (1)$$

$$t_H = \frac{c_1 \cdot V_{REF}}{I_{REF1}} \qquad (2)$$

$$t_L = \frac{c_2 \cdot V_{REF}}{I_{REF2}} \qquad (3)$$

The period of the clock signal can be obtained from pre-charge time of the node NET1 and NET2 (i.e., pre-charge the capacitors $C_1$, $C_2$) until they reach to the reference voltage $V_{REF}$. However, the faster the target cycle of the generated clock signal is, the more the response delay $t_{DLY1}$ and $t_{DLY2}$ on the amplifiers. This becomes an issue for generating an accurate clock signal. In addition, the input offset between the non-inverting input and the inverting input of the OP amplifiers A1, A2 is another issue.

In general, the clock signal usual has a cycle time $t_{CYC1}$ that comprises a high period $t_H$ and a low period $t_L$, which can be calculated as follow.

$$t_H = \frac{c_1(V_{REF} \pm V_{OFST1})}{I_{REF1}} + t_{DLY1}$$

$$t_L = \frac{c_2(V_{REF} \pm V_{OFST2})}{I_{REF2}} + t_{DLY2}$$

$$t_{CYC1} = \frac{c_1(V_{REF} \pm V_{OFST1})}{I_{REF1}} + \frac{c_2(V_{REF} \pm V_{OFST2})}{I_{REF2}} + t_{DLY1} + t_{DLY2}$$

As a result, the response delays $t_{DLY1}$, $t_{DLY2}$ and the input offset voltages $V_{OFST1}$, $V_{OFST2}$ of the amplifiers A1, A2 will reflect on the cycle time of the generated clock signal. Therefore, the resulted cycle time $t_{CYC1}$ will be longer than target cycle. Therefore, there is needs to develop an oscillator circuit capable of providing an accurate clock signal that eliminate the effect of the response delays and input offset voltages of the amplifier.

SUMMARY

According one embodiment of the disclosure, an oscillator circuit is provided, and includes an SR latch, receiving a first output signal and a second output signal, and generating an output and a contemporary output; a first cycle generating unit, receiving the output of the latch and generating the first output signal; a second cycle generating unit, receiving the contemporary output of the latch and generating the second output signal; a first duty generating unit, receiving the output of the latch and generating a third output signal; a second duty generating unit, receiving the contemporary output of the latch and generating a fourth output signal; a logic circuit, receiving the third output of the first duty generating unit, and the fourth output of the second duty generating unit, the output of the latch and the contemporary output of the latch, and generating a clock signal including even period parts each having an even cycle time and odd period parts each having an odd cycle time. The first cycle generating unit is operated to provide the even cycle time of the clock signal, the second cycle generating unit is operated to provide the odd cycle time of the clock signal, the first duty generating unit is operated to provide an even duty of the even period part of the clock signal, and the second duty generating unit is operated to provide an odd duty of the odd period part of the clock signal.

In one embodiment of the oscillator circuit, the first cycle generating unit comprises a first current source; a first OP amplifier having a non-inverting terminal, inverting terminal that receives a reference voltage, and an output that outputs the first output signal; a first capacitor C1 having one end coupled to the non-inverting terminal of the first OP amplifier and an another end that is grounded; a first switch having one end coupled to the one end of the first capacitor and an another end that is switched to couple to the first current source or the output of the SR latch.

In one embodiment of the oscillator circuit, the first duty generating unit comprises a third current source; a third OP amplifier having a non-inverting terminal, inverting terminal that receives the reference voltage, and an output that outputs the third output signal; a third capacitor having one end coupled to the non-inverting terminal of the third OP amplifier and an another end that is grounded; a third switch having one end coupled to the one end of the third capacitor and an another end that is switched to couple to the third current source or the output of the SR latch.

In one embodiment of the oscillator circuit, a ratio of a capacitance of the first capacitor to a first reference current of the first reference current source is larger than a ratio of a capacitance of the third capacitor to a third reference current of the third reference current source.

In one embodiment of the oscillator circuit, the second cycle generating unit comprises a second current source; a second OP amplifier having a non-inverting terminal, inverting terminal that receives a reference voltage, and an output that outputs the second output signal; a second capacitor having one end coupled to the non-inverting terminal of the second OP amplifier and an another end that is grounded; a second switch having one end coupled to the one end of the second capacitor and an another end that is switched to couple to the second current source or the contemporary output of the SR latch.

In one embodiment of the oscillator circuit, the second duty generating unit comprises a fourth current source; a fourth OP amplifier having a non-inverting terminal, inverting terminal that receives the reference voltage, and an output that outputs the fourth output signal; a fourth capacitor having one end coupled to the non-inverting terminal of the fourth OP amplifier and an another end that is grounded; a fourth switch having one end coupled to the one end of the fourth capacitor and an another end that is switched to couple to the fourth current source or the contemporary output of the SR latch.

In one embodiment of the oscillator circuit, a ratio of a capacitance of the second capacitor to a second reference current of the second reference current source is larger than a ratio of a capacitance of the fourth capacitor to a fourth reference current of the fourth reference current source.

In one embodiment of the oscillator circuit, the SR latch comprises a first NOR gate having a first input coupled to receive the first output of the first cycle generating unit, a second input and an output that outputs the contemporary output of the SR latch; and a second NOR gate having a first input coupled to receive the second output of the second cycle generating unit, a second input and an output that outputs the output of the SR latch. The second input of the first NOR gate is coupled to the output of the second NOR gate, and the second input of the second NOR gate is coupled to the output of the first NOR gate.

In one embodiment of the oscillator circuit, the logic circuit comprises a first NAND logic that receives the third output signal and the contemporary output of the SR latch; a second NAND logic that receives the fourth output signal and the output of the SR latch; and a third NAND logic that receives outputs of the first and the second NAND gates and outputs the clock signal.

In one embodiment of the oscillator circuit, each of the first cycle generating unit, the second cycle generating unit, the first duty generating unit, the second duty generating unit comprises a reference current source, a switch, an OP amplifier. In such configuration, a ratio of a capacitance of the capacitor to a reference current of the reference current source in the first cycle generating unit is larger than a ratio of a capacitance of the capacitor to a reference current of the reference current source in the first duty generating unit, and a ratio of a capacitance of the capacitor to a reference current of the reference current source in the second generating unit is larger than a ratio of a capacitance of the capacitor to a reference current of the reference current source in the second generating unit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
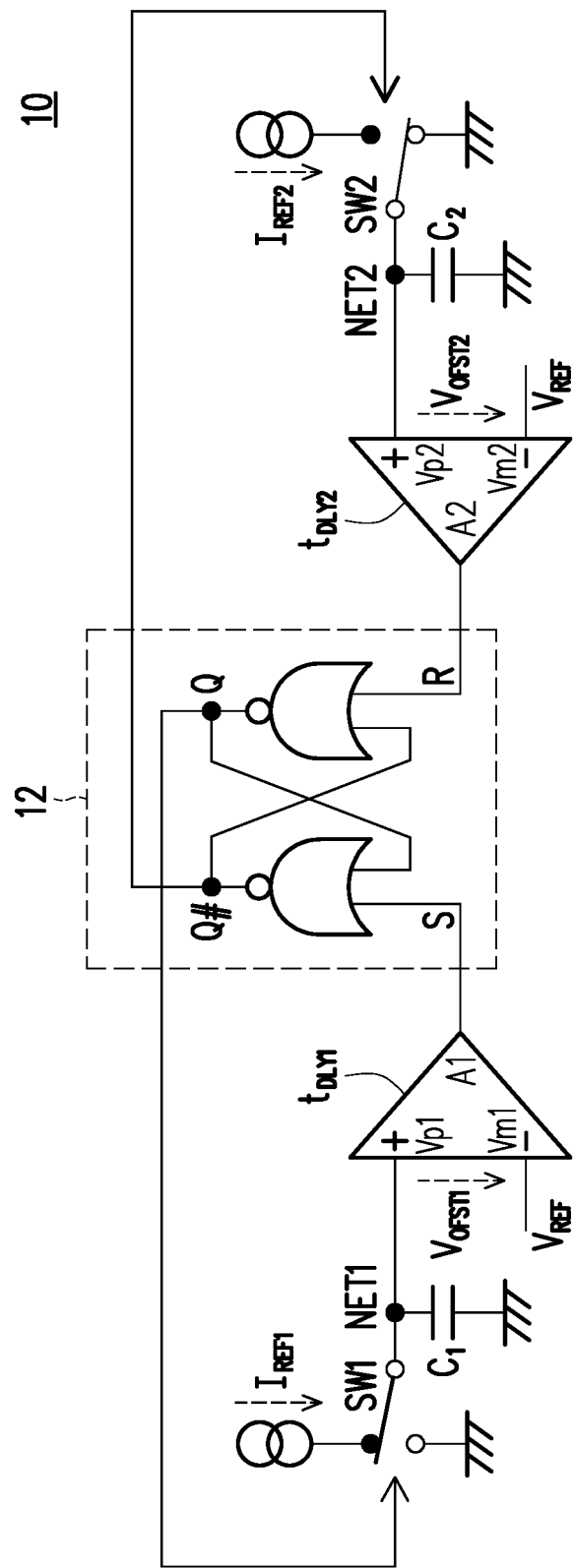
FIG. 1A illustrates a conventional oscillator circuit.
Figure 1B:
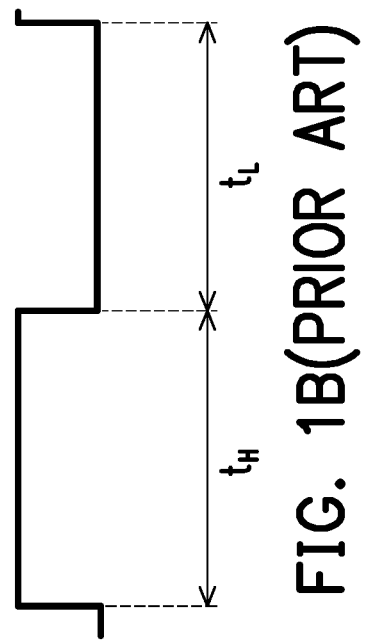
FIG. 1B illustrates a clock signal generated by the oscillator circuit shown in FIG. 1A.
Figure 2A:
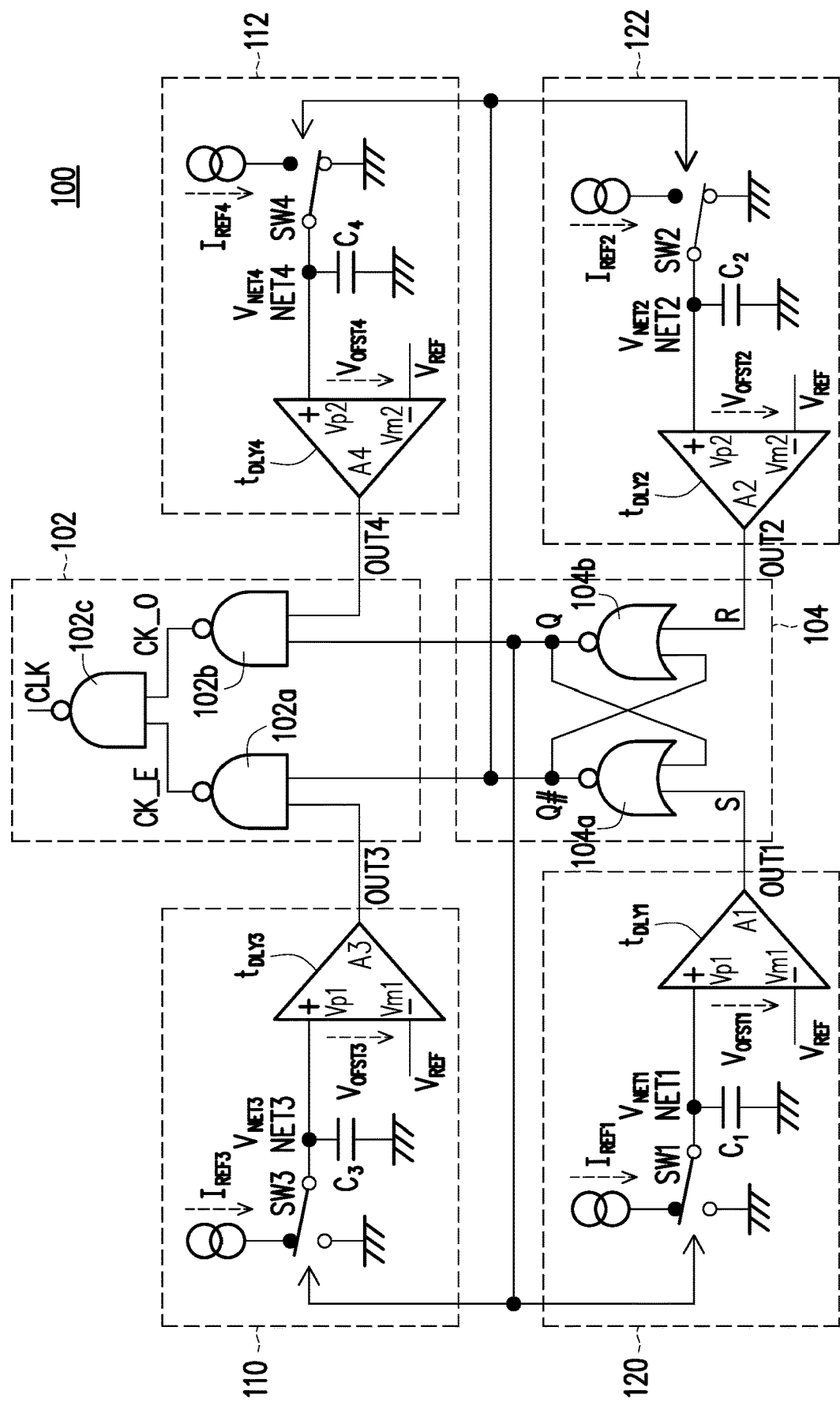
FIG. 2A illustrates an oscillator circuit according one embodiment of the disclosure.
Figure 2B:
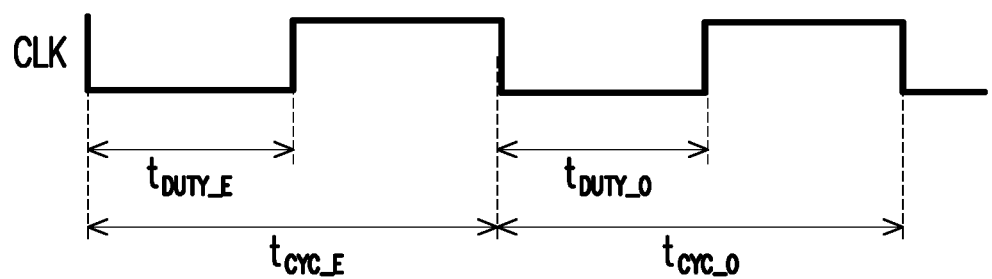
FIG. 2B illustrates a waveform of a clock signal generated by the oscillator circuit according one embodiment of the disclosure.

FIG. 2A illustrates an oscillator circuit according one embodiment of the disclosure, and FIG. 2B illustrate a waveform of a clock signal generated by the oscillator circuit. As shown in FIG. 2A, the oscillator circuit 100 comprises a first duty generating unit 110, a second duty generating unit 112, a first cycle generating unit 120, a second cycle generating unit 122, a logic circuit 102 and a latch 104. These circuit components are operated to generate a clock signal CLK as shown in FIG. 2B.

According to the embodiment, the clock signal CLK comprise even period parts and odd period parts that are alternatively repeated. Each even period part has an even cycle time $t_{CYC\_E}$ and each odd period part has an odd cycle time $t_{CYC\_O}$. In addition, the low portion of the even period part is defined as an even duty $t_{DUTY\_E}$ and the low portion of the odd period part is defined as an odd duty $t_{DUTY\_O}$. In the embodiment, the even cycle time $t_{CYC\_E}$, the odd cycle time $t_{CYC\_O}$, the even duty $t_{DUTY\_E}$ and odd duty $t_{DUTY\_O}$ can be controlled independently.

First, the overall configuration of the oscillator circuit 100 is described below. As shown in FIG. 2A, in the oscillator circuit 100 according to one embodiment of the disclosure, the latch 104 may be an SR latch (hereinafter, SR latch 104 will be used as an example). The SR latch 104 has two inputs in which one is a SET end S and the other is a RESET end R. In the embodiment, the SET end S receives a first output signal of the first cycle generating unit 120 and the RESET end R receives a second output signal of the second cycle generating unit 122. The SR latch 104 provides two outputs Q and Q# in which the output Q# is a contemporary output of the output Q.

In an example, the SR latch 104 may be designed to include two NOR gates 104a and 104b. One input of the NOR gate 104a is the SET end S, and the other input of the NOR gate 104a is connected to the output (i.e., the output Q) of the NOR gate 104b. One input of the NOR gate 104b is the RESET end R, and the other input of the NOR gate 104b is connected to the output (i.e., the contemporary output Q#) of the NOR gate 104a. The output Q and the contemporary output Q# are further provided to the logic circuit 102 as input signals.

In addition, the first cycle generating unit 120 has an input that receives the output Q of the SR latch 104 and an output that outputs the first output signal OUT1 generated by the first cycle generating unit 120 to one input (SET end S) of the SR latch 104. The first cycle generating unit 120 is used to control an even cycle time $t_{CYC\_E}$ of the clock signal CLK as shown in FIG. 2B.

In one example, the first cycle generating unit 120 comprises a first current source $I_{REF1}$, a first switch SW1, a first capacitor C1 and a first OP amplifier A1 (used as a comparator). One end of the first capacitor C1 is coupled to an input terminal (for example, the non-inverting input terminal Vp1) of the first OP amplifier A1 through a node NET1, and the other end of the first capacitor C1 is grounded. The one end of the first capacitor C1 is further coupled to one end of the first switch SW1 through the node NET1, and the other end of the first switch SW1 is coupled to the first current source $I_{REF1}$ or coupled to receive the output Q of the SR latch 104. The other input (for example, the inverting input terminal Vn1) of the first OP amplifier A1 is coupled to receive a reference voltage $V_{REF}$, and the output (i.e., the first output signal) OUT1 of the first OP amplifier A1 is provided to the SET end S of the SR latch 104. When the first switch SW1 is switched to couple to the first current source $I_{REF1}$, the current $I_{REF1}$ can pre-charge the first capacitor C1. In addition, the first OP amplifier A1 may have an input offset voltage $V_{OFST1}$ and a delay time $t_{DLY1}$.

In addition, the second cycle generating unit 122 has an input that receives the contemporary output Q # of the SR latch 104 and an output that outputs the second output signal OUT2 generated by the second cycle generating unit 122 to another input (i.e., RESET end R) of the SR latch 104. The second cycle generating unit 122 is used to control an odd cycle time $t_{CYC\_O}$ of the clock signal CLK as shown in FIG. 2B.

In one example, the second cycle generating unit 122 comprises a second current source $I_{REF2}$, a second switch SW2, a second capacitor C2 and a second OP amplifier A2. One end of the second capacitor C2 is coupled to an input terminal (for example, the non-inverting input terminal Vp2) of the second OP amplifier A2 through a node NET2, and the other end of the second capacitor C2 is grounded. The one end of the second capacitor C2 is further coupled to one end of the second switch SW2 through the node NET2, and the other end of the second switch SW2 is coupled to the second current source $I_{REF2}$ or coupled to receive the contemporary output Q # of the SR latch 104. The other input (for example, the inverting input terminal Vn2) of the second OP amplifier A2 is coupled to receive a reference voltage $V_{REF}$, and the output (i.e., the second output signal) OUT2 of the first OP amplifier A2 is provided to the RESET end R of the SR latch 104. When the second switch SW2 is switched to couple to the second current source $I_{REF2}$, the current $I_{REF2}$ can pre-charge the second capacitor C2. In addition, the second OP amplifier A2 may have an input offset voltage $V_{OFST2}$ and a delay time $t_{DLY2}$.

In addition, the first duty generating unit 110 has an input that receives the output Q of the SR latch 104 and an output that outputs the third output signal OUT3 generated by the first duty unit 110 to an input of the logic circuit 102. The first duty generating unit 122 is used to control an even duty $t_{DUTY\_E}$ of the clock signal CLK as shown in FIG. 2B.

In one example, the first duty generating unit 110 comprises a third current source $I_{REF3}$, a third switch SW3, a third capacitor C3 and a third OP amplifier A3. One end of the third capacitor C3 is coupled to an input terminal (for example, the non-inverting input terminal Vp1) of the third OP amplifier A3 through a node NET3, and the other end of the third capacitor C3 is grounded. The one end of the third capacitor C3 is further coupled to one end of the third switch SW3 through the node NET3, and the other end of the third switch SW3 is coupled to the third current source $I_{REF3}$ or coupled to receive the output Q of the SR latch 104. The other input (for example, the inverting input terminal Vn1) of the third OP amplifier A3 is coupled to a reference voltage $V_{REF}$, and the output (i.e., the third output signal) OUT3 of the third OP amplifier A3 is provided to an input of the logic circuit 102. When the third switch SW3 is switched to couple to the third current source $I_{REF3}$, the current $I_{REF3}$ can pre-charge the third capacitor C3. In addition, the third OP amplifier A3 may have an input offset voltage $V_{OFST3}$ and a delay time $t_{DLY3}$.

In addition, the second duty generating unit 112 has an input that receives the contemporary output Q # of the SR latch 104 and an output that outputs the fourth output signal OUT4 generated by the second duty unit 112 to an input of the logic circuit 102. The second duty generating unit 112 is used to control an odd duty $t_{DUTY\_O}$ of the clock signal CLK as shown in FIG. 2B.

In one example, the first duty generating unit 112 comprises a fourth current source $I_{REF4}$, a fourth switch SW4, a fourth capacitor C4 and a fourth OP amplifier A4. One end of the fourth capacitor C4 is coupled to an input terminal (for example, the non-inverting input terminal Vp1) of the fourth OP amplifier A4 through a node NET4, and the other end of the fourth capacitor C4 is grounded. The one end of the fourth capacitor C4 is further coupled to one end of the fourth switch SW4 through the node NET4, and the other end of the fourth switch SW4 is coupled to the third current source $I_{REF4}$ or coupled to receive the contemporary output Q # of the SR latch 104. The other input (for example, the inverting input terminal Vn1) of the fourth OP amplifier A4 is coupled to a reference voltage $V_{REF}$, and the output (i.e., the fourth output signal) OUT4 of the fourth OP amplifier A4 is provided to an input of the logic circuit 102. When the fourth switch SW4 is switched to couple to the fourth current source $I_{REF4}$, the current $I_{REF4}$ can pre-charge the fourth capacitor C4. In addition, the fourth OP amplifier A4 may have an input offset voltage $V_{OFST4}$ and a delay time $t_{DLY4}$.

In one example, the logic circuit 102 comprises a first NAND gate 102a, a second NAND gate 102b and a third NAND gate 102c, but not limited thereto. The logic circuit 102 can be designed to any combination of logic gates, provided that the logic circuit 102 can function to generate the clock signal CLK.

As shown in FIG. 2A, the first NAND gate 102a receives the third output signal OUT3 from the first duty generating circuit 110 and the contemporary output Q # from the SR latch 104. Then, the first NAND gate 102a generates a signal CK_E by performing NAND operation on the third output signal OUT3 and the contemporary output Q #. Similarly, the second NAND gate 102b receives the fourth output signal OUT4 from the fourth duty generating circuit 112 and the output Q from the SR latch 104. Then, the second NAND gate 102b generates a signal CK_O by performing NAND operation on the fourth output signal OUT4 and the output Q. The third NAND gate 102c receives the output CK_E of the first NAND gate 102a and the output CK_O of the second NAND gate 102b to generate the clock signal CLK.

In the operation of the oscillator circuit 100, the SR latch 104 can makes the even period part (even cycle) and the odd period part (odd cycle) of the clock signal CLK.

According to the embodiment, four sets of a reference current source, a capacitance, a switch and a comparator are used to generate the clock signal CLK. As shown in FIGS. 2A and 2B, the first cycle generating unit 120 is operated to generate the even cycle time $t_{CYC\_E}$ of the clock signal CLK and the second cycle generating unit 122 is operated to generate the odd cycle time $t_{CYC\_O}$ of the clock signal CLK. In addition, the first duty generating unit 110 is operated to generate the even duty $t_{DUTY\_E}$ of the clock signal CLK and the second duty generating unit 122 is operated to generate the odd duty time $t_{DUTY\_O}$ of the clock signal CLK.

Therefore, the even and odd cycle times $t_{CYC\_E}$, $t_{CYC\_O}$ as well as the even and odd duty $t_{DUTY\_E}$, $t_{DUTY\_O}$ can set individually. According to the embodiment, the cycle time $t_{CYC\_E}$, $t_{CYC\_O}$ and the duty $t_{DUTY\_E}$, $t_{DUTY\_O}$ are obtained from the capacitances and the reference currents of the first and second cycle generating units 120, 122 and the first and second duty generating units 110, 112 according to the following formula (4)-(7).

$$t_{CYC\_E} = \frac{c_1(V_{REF} \pm V_{OFST1})}{I_{REF1}} + t_{DLY1} \qquad (4)$$

$$t_{CYC\_O} = \frac{c_2(V_{REF} \pm V_{OFST2})}{I_{REF2}} + t_{DLY2} \qquad (5)$$

$$t_{DUTY\_E} = \frac{c_3(V_{REF} \pm V_{OFST3})}{I_{REF3}} + t_{DLY3} \qquad (6)$$

-continued $$t_{DUTY\_O} = \frac{C_4(V_{REF} \pm V_{OFST4})}{I_{REF4}} + t_{DLY4} \quad (7)$$

In addition, the circuit configurations of the first duty (even duty) generating unit 110, the second duty (odd duty) generating unit 112, the first cycle (even cycle) generating unit 120 and the second cycle (odd cycle) generating unit 122 may be the same. However, in order to make sure the relationship of the cycle time and the duty of the clock signal CLK. The capacitances and the reference currents have to meet the following relationship.

$$\frac{C_1}{I_{REF1}} > \frac{C_3}{I_{REF3}} \text{ and } \frac{C_2}{I_{REF2}} > \frac{C_4}{I_{REF4}}$$

According to the following formula (4)-(7), since the input offset voltages and the delay time of the OP amplifies A1~A4 can be reduced by half, the clock signal CLK generated by the oscillator circuit 100 of the embodiment can be better in accuracy.

Next, the operation of the oscillator circuit according to the embodiment will be described in detail with reference to FIG. 3 to FIG. 6.

Figure 3:
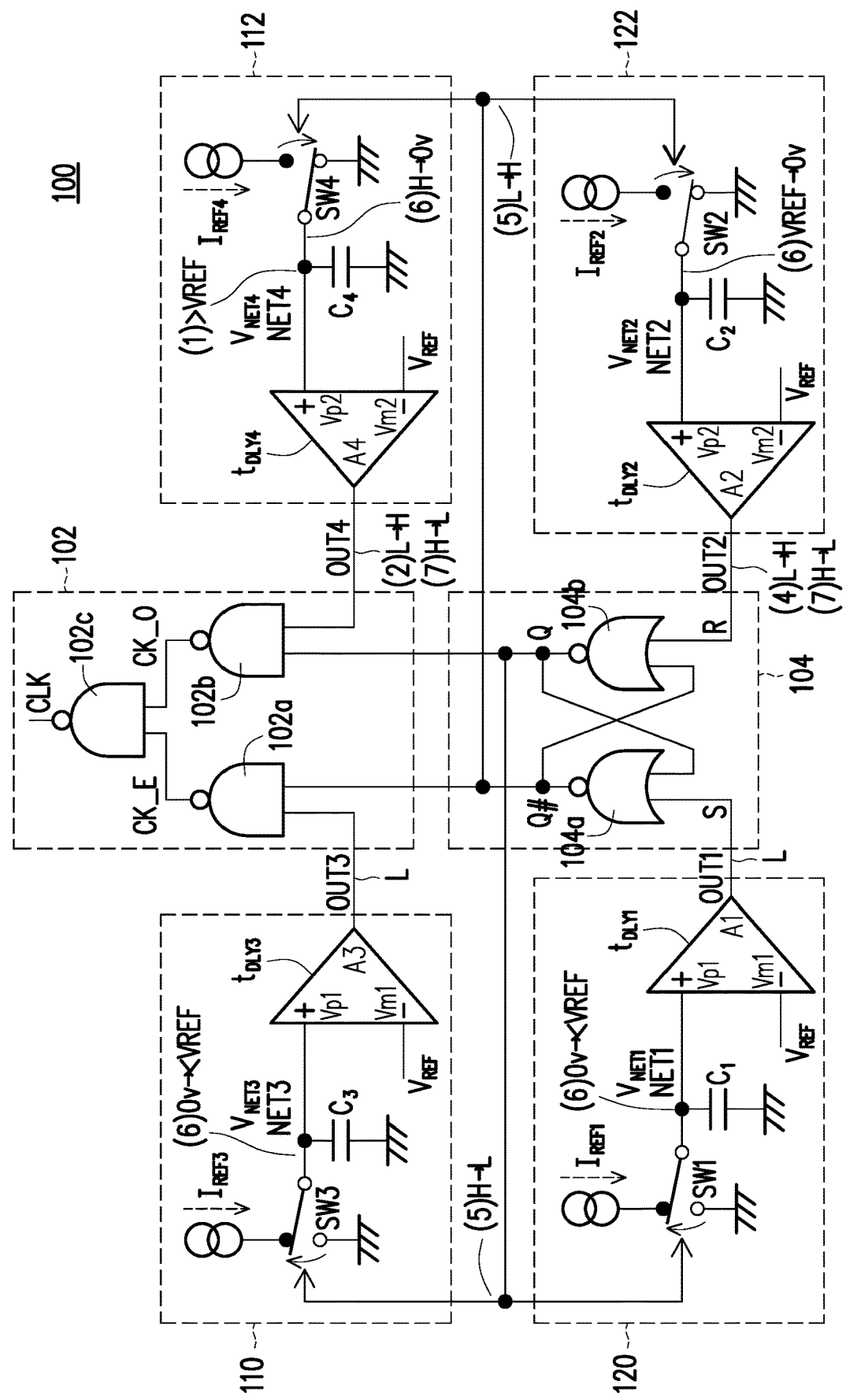
FIG. 3 illustrates a circuit status for generating the odd period part of the clock signal.
Figure 4:
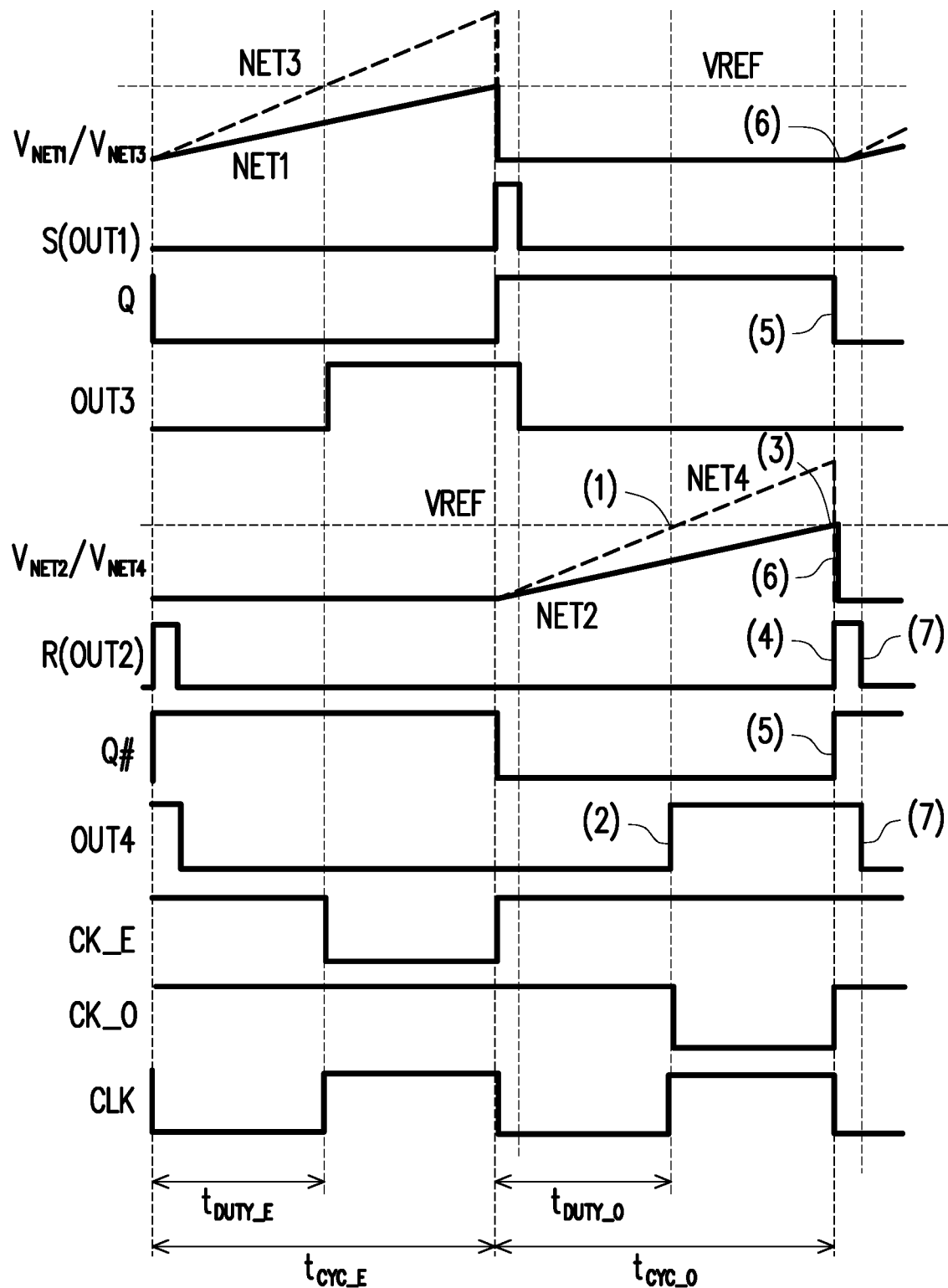
FIG. 4 illustrates a waveform in the oscillator circuit for generating the odd period part of the clock signal.

First, the operations in the odd period sequences are described with reference to FIGS. 3 and 4. In an example, referring to FIG. 4, at sequence (1), the contemporary output Q # of the SR latch 104 is at low level L. The fourth reference current source $I_{REF4}$ constantly rises up the voltage $V_{NET4}$ at the node NET4. As shown in FIG. 4, the voltage $V_{NET4}$ at the node NET4 gradually increases (dashed line). At sequence (2), when the voltage $V_{NET4}$ at the node NET4 reaches the reference voltage $V_{REF}$, or begin to be larger than the reference voltage $V_{REF}$, the output OUT4 of the fourth OP amplifier A4 outputs the high level H, i.e., the output OUT4 is transient from the low level L to the high level H.

Then, at sequence (3), the second reference current source $I_{REF2}$ also constantly rises up the voltage $V_{NET2}$ at the node NET2. As shown in FIG. 4, the voltage $V_{NET2}$ at the node NET2 also gradually increases (solid line). Then, at sequence (4), when the voltage $V_{NET2}$ at the node NET2 reaches the reference voltage $V_{REF}$, the output OUT2 of the second OP amplifier A2 outputs the high level H. The second output signal, i.e., the output OUT2, of the second OP amplifier A2 is provided to the RESET end R of the SR latch 104, so that the voltage at the RESET end R is transient from the low level L to the high level H.

At this time, the RESET end R is at the high level H and the SET end S is at the low level L. Then, at sequence (5), the output Q of the SR latch 104 is transient from the high level H to the low level L, and the contemporary output Q # of the SR latch 104 is transient from the low level L to the high level H.

Then, at sequence (6), the first switch SW1 of the first cycle generating unit 120 and the first switch SW3 of the first duty generating unit 110 are respectively switched to coupled to the first reference current source $I_{REF1}$ and the third reference current source $I_{REF3}$. Then, in the first cycle generating unit 120, the grounded node NET1 (0V) is pre-charged by the first reference current source $I_{REF1}$ to be lower than the reference voltage $V_{REF}$ ($V_{NET1}$ is changed from 0V to being smaller than $V_{REF}$), and in the first duty generating unit 110, the grounded node NET3 (0V) is pre-charged by the third reference current source $I_{REF3}$ to be lower than the reference voltage $V_{REF}$ ($V_{NET3}$ is changed from 0V to being smaller than $V_{REF}$).

Meanwhile, the second switch SW2 of the second cycle generating unit 122 and the fourth switch SW4 of the second duty generating unit 112 are switched to coupled to the ground. As a result, the voltage $V_{NET4}$ at the node NET4 and the voltage $V_{NET2}$ at the node NET2 are forced to be grounded, i.e., 0V. Then, at sequence (7), after the nodes NET2 and NET4 are forced to ground, the second output signal OUT2 (i.e., the RESET end R) and the fourth output signal OUT4 are transient from the high level H to the low level L.

As described above, after the oscillator circuit 100 is operated from sequence (1) to sequence (7), the odd period part of the clock signal CLK is generated and the logic circuit 102 outputs the odd period part of the clock signal CLK with an odd duty $t_{DUTY\_O}$ and an odd cycle $t_{CYC\_O}$ as shown in FIG. 4.

Figure 5:
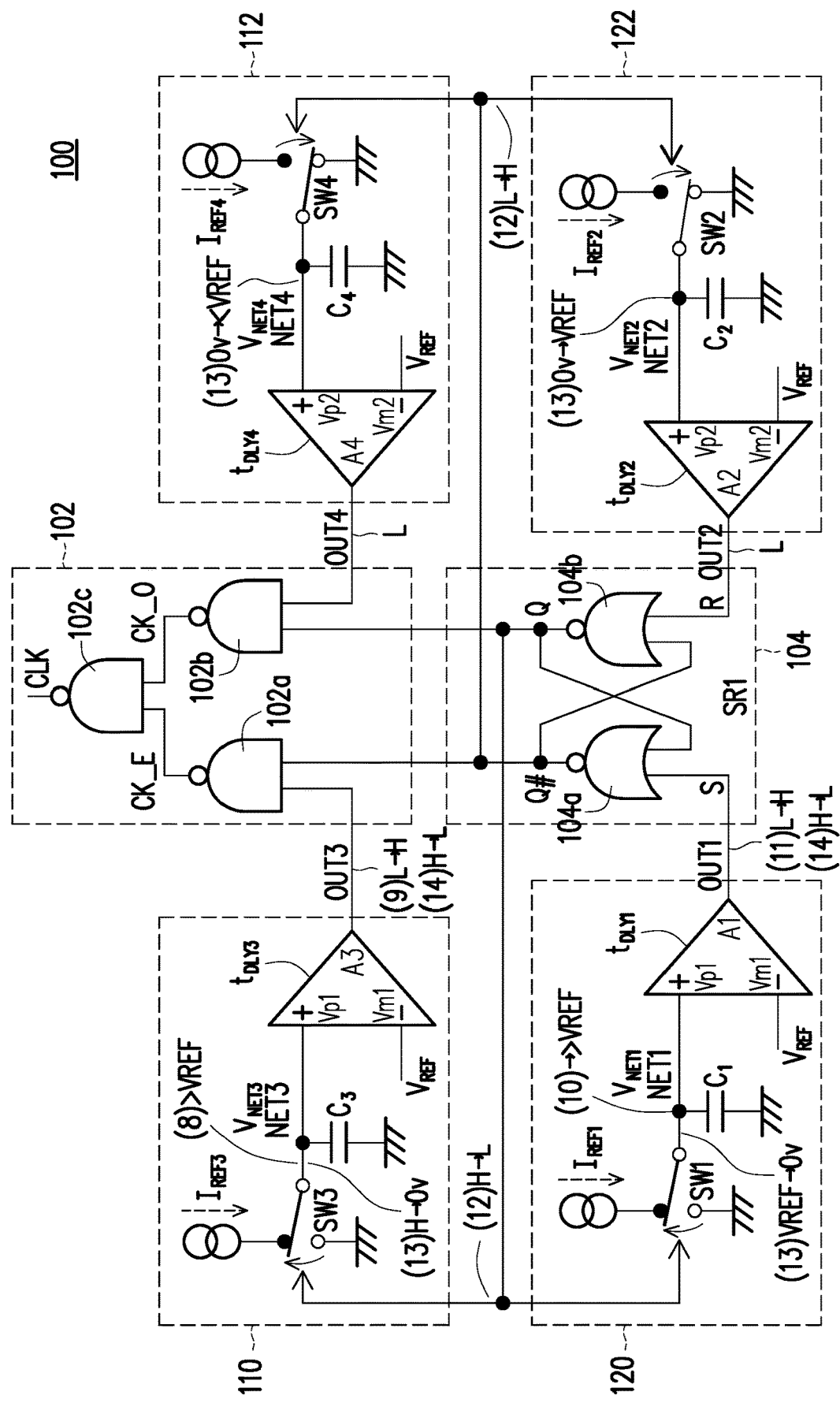
FIG. 5 illustrates a circuit status for generating the even period part of the clock signal.
Figure 6:
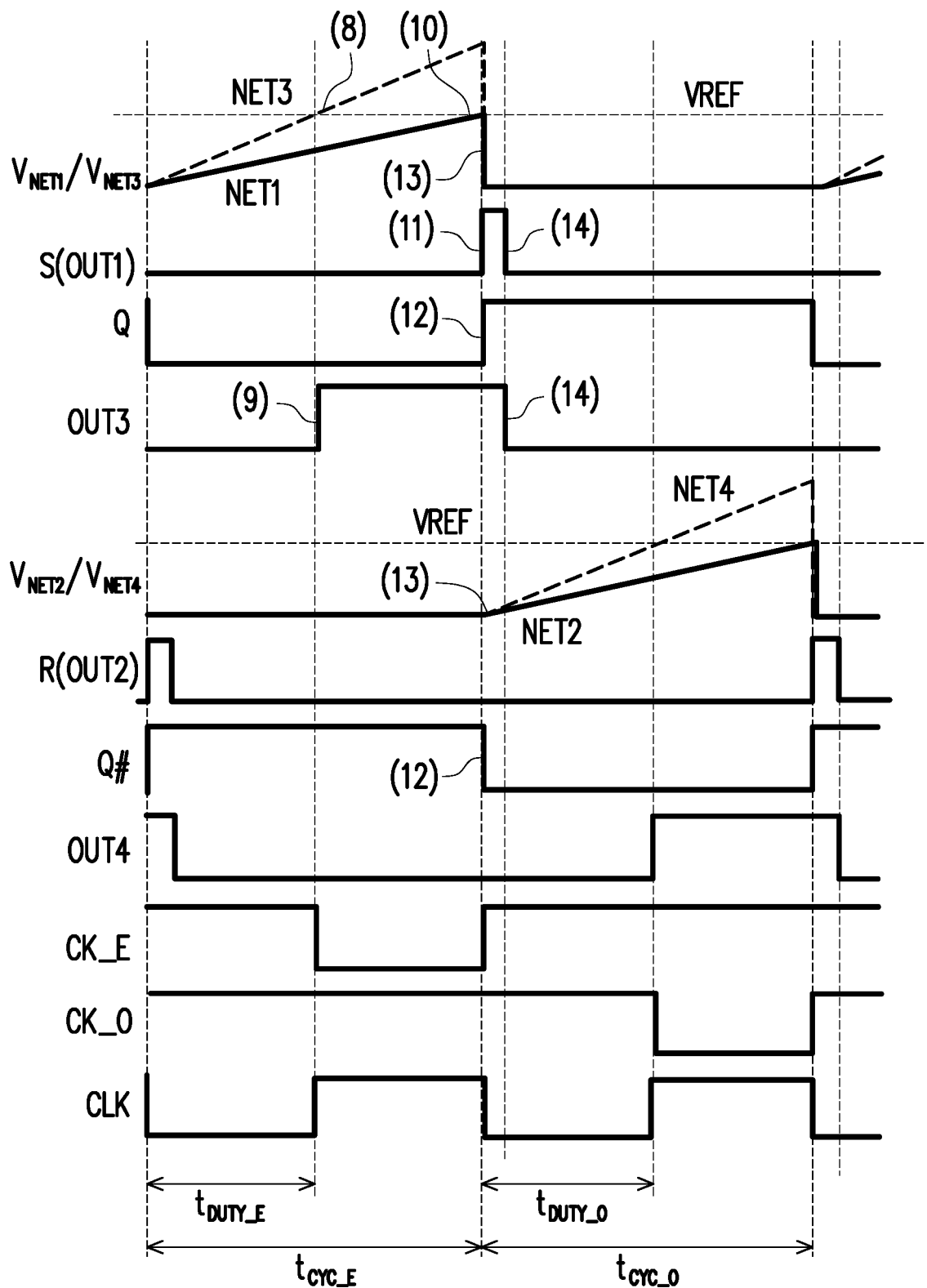
FIG. 6 illustrates a waveform in the oscillator circuit for generating the even period part of the clock signal.

The operations in the even period sequences are described with reference to FIGS. 5 and 6. In an example, referring to FIG. 6, at sequence (8), the output Q of the SR latch 104 is at low level L. The third reference current source $I_{REF3}$ constantly rises up the voltage $V_{NET3}$ at the node NET3. As shown in FIG. 6, the voltage $V_{NET3}$ at the node NET3 gradually increases (dashed line). At sequence (9), when the voltage $V_{NET3}$ at the node NET3 reaches the reference voltage $V_{REF}$, or begin to be larger than the reference voltage $V_{REF}$, the output OUT3 of the third OP amplifier A3 outputs the high level H, i.e, the output OUT3 is transient from the low level L to the high level H.

Then, at sequence (10), the first reference current source $I_{REF1}$ also constantly rises up the voltage $V_{NET1}$ at the node NET1. As shown in FIG. 6, the voltage $V_{NET1}$ at the node NET1 also gradually increases (solid line). Then, at sequence (11), when the voltage $V_{NET1}$ at the node NET1 reaches the reference voltage $V_{REF}$, the output OUT1 of the first OP amplifier A1 outputs the high level H. Then, the second output signal, i.e., the output OUT1, of the first OP amplifier A1 is provided to the SET end S of the SR latch 104, so that the voltage at the SET end S is transient from the low level L to the high level H.

At this time, the SET end S is at the high level H and the RESET end R is at the low level L. Then, at sequence (12), the output Q of the SR latch 104 is transient from the high level H to the low level L, and the contemporary output Q # of the SR latch 104 is transient from the low level L to the high level H.

Then, at sequence (13), the second switch SW2 of the second cycle generating unit 122 and the fourth switch SW4 of the second duty generating unit 112 are respectively switched to coupled to the first reference current source $I_{REF2}$ and the third reference current source $I_{REF1}$. Then, in the second cycle generating unit 122, the grounded node NET2 (0V) is pre-charged by the second reference current source $I_{REF2}$ to be lower than the reference voltage $V_{REF}$ ($V_{NET2}$ is changed from 0V to being smaller than $V_{REF}$), and in the second duty generating unit 112, the grounded node NET4 (0V) is pre-charged by the fourth reference current source $I_{REF4}$ to be lower than the reference voltage $V_{REF}$ ($V_{NET4}$ is changed from 0V to being smaller than $V_{REF}$).

Meanwhile, the first switch SW1 of the first cycle generating unit 120 and the third switch SW3 of the first duty generating unit 110 are switched to coupled to the ground. As a result, the voltage $V_{NET1}$ at the node NET1 and the voltage $V_{NET3}$ at the node NET3 are forced to be grounded, i.e., 0V. Then, at sequence (14), after the nodes NET1 and NET3 are forced to ground, the first output signal OUT1

(i.e., the SET end S) and the third output signal OUT3 are transient from the high level H to the low level L.

As described above, after the oscillator circuit 100 is operated from sequence (8) to sequence (14), the even period part of the clock signal CLK is generated and the logic circuit 102 outputs the even period part of the clock signal CLK with an even duty $t_{DUTY\_E}$ and an even cycle $t_{CYC\_E}$ as shown in FIG. 6.

Them, the operation of the oscillator 100 returns to sequence (1). In this way, the sequences (1) to (14) are repeatedly performed, and therefore, a clock signal CLK is generated.

As described above, since the capacitances and reference currents of the four units 110, 112, 120 and 122 can be respectively set, and therefore, the four units 110, 112, 120 can respectively determine the even duty $t_{DUTY\_E}$, the odd duty $t_{DUTY\_O}$, the even cycle $t_{CYC\_E}$ the odd cycle $t_{CYC\_O}$ of the clock signal CLK. In addition, as described above, because the input offset voltages and the delay time of the OP amplifies (comparators) can be reduced by half, the generated clock signal CLK generated by the oscillator circuit 100 can be better in accuracy.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An oscillator circuit, comprising:
   an SR latch, receiving a first output signal and a second output signal, and generating an output and a contemporary output;
   a first cycle generating unit, receiving the output of the latch and generating the first output signal;
   a second cycle generating unit, receiving the contemporary output of the latch and generating the second output signal;
   a first duty generating unit, receiving the output of the latch and generating a third output signal;
   a second duty generating unit, receiving the contemporary output of the latch and generating a fourth output signal;
   a logic circuit, receiving the third output of the first duty generating unit, and the fourth output of the second duty generating unit, the output of the latch and the contemporary output of the latch, and generating a clock signal including even period parts each having an even cycle time and odd period parts each having an odd cycle time,
   wherein the first cycle generating unit is operated to provide the even cycle time of the clock signal,
   the second cycle generating unit is operated to provide the odd cycle time of the clock signal,
   the first duty generating unit is operated to provide an even duty of the even period part of the clock signal, and
   the second duty generating unit is operated to provide an odd duty of the odd period part of the clock signal.

2. The oscillator circuit according to claim 1, wherein the first cycle generating unit comprises:
   a first current source;
   a first OP amplifier having a non-inverting terminal, inverting terminal that receives a reference voltage, and an output that outputs the first output signal;
   a first capacitor C1 having one end coupled to the non-inverting terminal of the first OP amplifier and an another end that is grounded;
   a first switch having one end coupled to the one end of the first capacitor and an another end that is switched to couple to the first current source or the output of the SR latch.

3. The oscillator circuit according to claim 2, wherein the first duty generating unit comprises:
   a third current source;
   a third OP amplifier having a non-inverting terminal, inverting terminal that receives the reference voltage, and an output that outputs the third output signal;
   a third capacitor having one end coupled to the non-inverting terminal of the third OP amplifier and an another end that is grounded;
   a third switch having one end coupled to the one end of the third capacitor and an another end that is switched to couple to the third current source or the output of the SR latch.

4. The oscillator circuit according to claim 3, wherein a ratio of a capacitance of the first capacitor to a first reference current of the first reference current source is larger than a ratio of a capacitance of the third capacitor to a third reference current of the third reference current source.

5. The oscillator circuit according to claim 1, wherein the second cycle generating unit comprises:
   a second current source;
   a second OP amplifier having a non-inverting terminal, inverting terminal that receives a reference voltage, and an output that outputs the second output signal;
   a second capacitor having one end coupled to the non-inverting terminal of the second OP amplifier and an another end that is grounded;
   a second switch having one end coupled to the one end of the second capacitor and an another end that is switched to couple to the second current source or the contemporary output of the SR latch.

6. The oscillator circuit according to claim 5, wherein the second duty generating unit comprises:
   a fourth current source;
   a fourth OP amplifier having a non-inverting terminal, inverting terminal that receives the reference voltage, and an output that outputs the fourth output signal;
   a fourth capacitor having one end coupled to the non-inverting terminal of the fourth OP amplifier and an another end that is grounded;
   a fourth switch having one end coupled to the one end of the fourth capacitor and an another end that is switched to couple to the fourth current source or the contemporary output of the SR latch.

7. The oscillator circuit according to claim 6, wherein a ratio of a capacitance of the second capacitor to a second reference current of the second reference current source is larger than a ratio of a capacitance of the fourth capacitor to a fourth reference current of the fourth reference current source.

8. The oscillator circuit according to claim 1, wherein the SR latch comprises:
   a first NOR gate having a first input coupled to receive the first output of the first cycle generating unit, a second input and an output that outputs the contemporary output of the SR latch; and a second NOR gate having a first input coupled to receive the second output of the second cycle generating unit, a second input and an output that outputs the output of the SR latch, wherein the second input of the first NOR gate is coupled to the output of the second NOR gate, and the second input of the second NOR gate is coupled to the output of the first NOR gate.

9. The oscillator circuit according to claim 1, wherein the logic circuit comprises:
   a first NAND logic that receives the third output signal and the contemporary output of the SR latch;
   a second NAND logic that receives the fourth output signal and the output of the SR latch; and
   a third NAND logic that receives outputs of the first and the second NAND gates and outputs the clock signal.

10. The oscillator circuit according to claim 1, wherein each of the first cycle generating unit, the second cycle generating unit, the first duty generating unit, the second duty generating unit comprises a reference current source, a switch, an OP amplifier,
   a ratio of a capacitance of the capacitor to a reference current of the reference current source in the first cycle generating unit is larger than a ratio of a capacitance of the capacitor to a reference current of the reference current source in the first duty generating unit,
   a ratio of a capacitance of the capacitor to a reference current of the reference current source in the second generating unit is larger than a ratio of a capacitance of the capacitor to a reference current of the reference current source in the second generating unit.

* * * * *